United States Patent
Kelly et al.

(10) Patent No.: US 9,603,282 B2
(45) Date of Patent: Mar. 21, 2017

(54) DATACENTER AND COOLING CONTROL FAULT-TOLERANCE USING COMPUTE RESOURCES

(71) Applicant: Microsoft Corporation, Redmond, WA (US)

(72) Inventors: Bryan David Kelly, Redmond, WA (US); Badriddine Khessib, Redmond, WA (US); Sriram Govindan, Redmond, WA (US); Sriram Sankar, Redmond, WA (US); Brandon Aaron Rubenstein, Lynnwood, WA (US)

(73) Assignee: Microsoft Technology Licensing, LLC, Redmond, WA (US)

( * ) Notice: Subject to any disclaimer, the term of this patent is extended or adjusted under 35 U.S.C. 154(b) by 482 days.

(21) Appl. No.: 14/147,494

(22) Filed: Jan. 3, 2014

(65) Prior Publication Data

US 2015/0192936 A1    Jul. 9, 2015

(51) Int. Cl.
G06F 15/16    (2006.01)
H05K 7/20    (2006.01)
(Continued)

(52) U.S. Cl.
CPC .............. *H05K 7/20* (2013.01); *G06F 1/206* (2013.01); *H05K 7/1498* (2013.01); *G06F 1/203* (2013.01)

(58) Field of Classification Search
CPC ........ H05K 7/20; H05K 7/1498; G06F 1/203; G06F 1/206
(Continued)

(56) References Cited

U.S. PATENT DOCUMENTS 4,656,553 A * 4/1987 Brown ...................... H02P 6/08
                                                                    318/254.1
6,467,695 B1 * 10/2002 Riley ................... F24F 11/0017
                                                                    236/49.3
(Continued)

FOREIGN PATENT DOCUMENTS

WO    2012047746 A2    4/2012

OTHER PUBLICATIONS

Rasmussen, Neil, "Power and Cooling Capacity Management for Data Centers", Published on: Dec. 2010, Available at: http://www.apcmedia.com/salestools/NRAN-6C25XM/NRAN-6C25XM_R3_EN.pdf.
(Continued)

*Primary Examiner* — Michael Y Won
(74) *Attorney, Agent, or Firm* — The Watson IP Group, PLC; Vladan M. Vasiljevic

(57) ABSTRACT

Management of infrastructure devices is performed by computing devices that are associated with the processing being provided by the data center, such as chassis managers. A master is first selected through polling or consensus algorithms, and then subsequently the master is endowed with the authority to manage infrastructure devices and generate the control output to such infrastructure devices. Alternatively, no master need be elected and, instead, output to such infrastructure devices is generated by a computing device selected utilizing polling or consensus algorithms, and in accordance with a management decision made through polling or consensus algorithms. The interplay between the cooling apparatuses of individual server computing devices and the cooling apparatuses of the data center as a whole is also managed to increase the portion of the cooling of server computing devices provided by data center air movers.

(Continued)

Control of data center air movers can be determined empirically or predictively.

20 Claims, 7 Drawing Sheets

(51) Int. Cl.
*H05K 7/14* (2006.01)
*G06F 1/20* (2006.01)

(58) Field of Classification Search
USPC ......... 700/300; 709/203, 208, 217, 220, 223
See application file for complete search history.

(56) References Cited

U.S. PATENT DOCUMENTS

| | | | |
|---|---|---|---|
| 7,957,132 B2* | 6/2011 | Fried | F28D 15/0266 165/185 |
| 8,346,398 B2 | 1/2013 | Ahmed et al. | |
| 8,595,535 B1* | 11/2013 | Tamilarasan | G06F 11/3034 700/297 |
| 8,820,113 B2* | 9/2014 | Heydari | 361/699 |
| 2002/0066422 A1* | 6/2002 | Hawkins | F01P 7/044 123/41.12 |
| 2004/0099747 A1* | 5/2004 | Johnson | H05K 7/20836 236/49.3 |
| 2004/0141542 A1* | 7/2004 | Sharma | G01K 7/42 374/141 |
| 2005/0145366 A1* | 7/2005 | Erel | H01L 23/467 165/80.3 |
| 2006/0186224 A1* | 8/2006 | Yoshii | B60H 1/00378 239/436 |
| 2008/0041076 A1* | 2/2008 | Tutunoglu | F24F 11/0086 62/181 |
| 2008/0245083 A1* | 10/2008 | Tutunoglu | F24F 11/0086 62/115 |
| 2008/0288607 A1* | 11/2008 | Muchow | G06F 9/44505 709/209 |
| 2009/0025410 A1* | 1/2009 | Tanaka | F25B 41/043 62/228.1 |
| 2009/0266511 A1* | 10/2009 | Yang | G11B 33/144 165/80.2 |
| 2010/0170277 A1* | 7/2010 | Schmitt | H05K 7/20745 62/259.2 |
| 2010/0293977 A1* | 11/2010 | Tanaka | F25D 11/00 62/186 |
| 2010/0317278 A1* | 12/2010 | Novick | H05K 7/20836 454/184 |
| 2011/0128699 A1* | 6/2011 | Heydari | H05K 7/20745 361/679.48 |
| 2011/0178665 A1* | 7/2011 | Yoshioka | B60W 10/06 701/22 |
| 2012/0041600 A1* | 2/2012 | Michael | G05D 23/1932 700/276 |
| 2012/0133152 A1* | 5/2012 | Wagoner | F03D 80/00 290/1 B |
| 2012/0155027 A1* | 6/2012 | Broome | H05K 7/1497 361/696 |
| 2012/0211198 A1* | 8/2012 | Kinkel | F24F 1/02 165/104.14 |
| 2012/0318014 A1* | 12/2012 | Huff | F25B 1/10 62/228.1 |
| 2012/0331317 A1 | 12/2012 | Rogers et al. | |
| 2013/0019124 A1 | 1/2013 | Grimshaw | |
| 2013/0104136 A1 | 4/2013 | Brech et al. | |
| 2013/0133350 A1* | 5/2013 | Reytblat | H05K 7/20718 62/259.2 |
| 2013/0138769 A1* | 5/2013 | Wang | H04L 41/0853 709/217 |
| 2013/0158713 A1 | 6/2013 | Geissler et al. | |
| 2013/0205822 A1* | 8/2013 | Heiland | H05K 7/2079 62/259.2 |
| 2013/0233532 A1* | 9/2013 | Imwalle | F28F 27/02 165/287 |
| 2013/0317785 A1* | 11/2013 | Chainer | H05K 7/20836 703/1 |
| 2013/0340995 A1* | 12/2013 | David | F28F 27/00 165/287 |
| 2014/0014292 A1* | 1/2014 | Rice | H05K 7/20745 165/11.1 |
| 2014/0118924 A1* | 5/2014 | Magarelli | G06F 1/206 361/679.46 |
| 2014/0258224 A1* | 9/2014 | Song | G06F 17/30289 707/610 |
| 2014/0366815 A1* | 12/2014 | Lu | F28F 13/12 123/41.1 |
| 2015/0098180 A1* | 4/2015 | Berghe | H05K 7/20736 361/679.48 |

OTHER PUBLICATIONS

Niles, et al., "Virtualization and Cloud Computing: Optimized Power, Cooling, and Management Maximizes Benefits", Published on: Dec. 2010, Available at: http://www.apcmedia.com/salestools/SNIS-7AULCP/SNIS-7AULCP_R4_EN.pdf.

"SynapSense™ Launches Breakthrough Adaptive Control™ Technology to Automate Data Center Cooling", Published on: May 13, 2010, Available at: http://www.businesswire.com/news/home/20100513005459/en/SynapSense%E2%84%A2-Launches-Breakthrough-Adaptive-Control%E2%84%A2-Technology-Automate.

Phelps, Wally, "Airflow Management for an Efficient Data Center", Published on: Sep. 28, 2012, Available at: http://www.datacenterjournal.com/general/airflow-management-for-an-efficient-data-center/.

"Dynamic Airflow Management", Retrieved on: Jul. 26, 2013, Available at: http://www.nerdata.com/cooling_Dynamic_Airflow_Management.htm.

"Data Center Cooling & Power Products", Retrieved on: Jul. 26, 2013, Available at: http://www.opengatedata.com/data-center-cooling-power-products.html.

* cited by examiner

DATACENTER AND COOLING CONTROL
FAULT-TOLERANCE USING COMPUTE
RESOURCES

BACKGROUND

Increasingly, people are relying on computing services and functionality that is provided from remote computing devices that are communicationally coupled to each individual user's computing device. For example, web search engines, cloud-backed business applications and web-based video streaming and social media entertainment are becoming increasingly popular. Moreover, the prevalence of high-speed computer network communication capabilities for people in different parts of the world, both in their office as well as in their homes, has increased accessibility and aided adoption and utilization of these network-based services. This has correspondingly placed heavy data processing and computational demands on the providers of such services.

To provide such data and processing capabilities, via network communications, computing devices are often centralized in a single location. Such a centralized location typically comprises hundreds or thousands of computing devices, typically mounted in vertically oriented racks. Such a collection of computing devices, as well as the associated hardware necessary to infrastructure such computing devices, and the physical structure that houses the computing devices and associated hardware, is traditionally referred to as a "data center". With the increasing availability of high-speed network communication capabilities, and thus the increasing provision of data and services from centralized locations, as well as the traditional utilization of data centers, such as the provision of advanced computing services and massive amounts of computing processing capability, the size and quantity of data centers continues to increase.

Data centers typically comprise both the computing devices that perform the processing that the data center provides to its customers and infrastructure devices that provide power, cooling and other like infrastructure services to provide a proper operating environment for the computing devices. The infrastructure devices of the data center can be managed by computing devices that are dedicated specifically to such management of infrastructure devices, and which are not part of the computing devices that perform the processing that the data center provides to its customers. The computing devices that perform the processing that the data center provides to its customers are typically housed in chassis, which are then, in turn, arranged in vertical racks. Each chassis includes, not only the computing devices performing the processing of the data center, but also computing devices dedicated to managing hardware and software aspects of the chassis itself, such as monitoring the power supply or fans of the chassis, monitoring the computing hardware installed in the chassis, and other like chassis management functionality. To save cost, such chassis manager computing devices typically do not comprise the processing capabilities of the computing devices installed in the chassis.

Redundancy is utilized to protect against failures that reduce the ability of the data center to provide computing services and, consequently, negatively impact the revenue of the data center. As such, various infrastructure functions of the data center are provided by primary systems, which are, in turn, backed up by secondary or tertiary systems. For example, the power provided to a data center, such as electrical grid power, is typically backed up by a backup power source, such as a generator. In a similar manner, the computing devices that manage and control the infrastructure devices of the data center typically comprise some amount of redundancy. As a result, data centers typically comprise at least three different sets of computing devices, including the computing devices that actually perform the processing that the data center sells to its customers, the chassis manager computing devices, and the infrastructure device management computing devices.

SUMMARY

In one embodiment, management of infrastructure devices, such as in a data center, can be performed by computing devices that are associated with the processing provided by the data center to its customers. The control and management of infrastructure devices can be performed by the same computing devices that are also performing the processing of the data center, or by the chassis manager computing devices that manage the chassis into which such computing devices are installed. In such a manner, no dedicated computing devices are required for the management of infrastructure devices, thereby reducing the cost and complexity of the data center, and providing infrastructure control computing devices that have greater redundancy and fault tolerance then would dedicated computing devices that would have been directed only to the management of infrastructure devices. Furthermore, because the computing devices associated with the processing provided by the data center can control that processing, providing for their control of infrastructure devices enables symbiotic decisions to be made and corresponding efficiencies to be realized.

In another embodiment, multiple computing devices, such as chassis manager computing devices, can provide management of infrastructure devices by first selecting a master computing device through known polling or consensus algorithms, and then subsequently endowing the master with the authority to manage infrastructure devices and generate output to control such infrastructure devices.

In yet another embodiment, multiple computing devices, such as chassis manager computing devices, can provide management of infrastructure devices through known polling or consensus algorithms, whereby generated output to such infrastructure devices is generated by a computing device that is selected in accordance with such polling or consensus algorithms, and is generated in accordance with a management decision made via such polling or consensus algorithms.

In a further embodiment, one aspect of the infrastructure devices that can be managed can be the interplay between the cooling apparatuses of individual server computing devices and the cooling apparatuses of the data center as a whole. Such management can seek to increase the portion of the cooling of server computing devices provided by data center air movers, and decrease the portion of the cooling of server computing devices provided by the individual cooling apparatuses of such server computing devices. The amount of power consumed by cooling devices in aggregate can, thereby, be decreased, due to the greater efficiency of data center air movers, as compared with individual server cooling apparatuses.

In a still further embodiment, control of data center air movers can be determined empirically or predictively.

This Summary is provided to introduce a selection of concepts in a simplified form that are further described below in the Detailed Description. This Summary is not intended to identify key features or essential features of the claimed subject matter, nor is it intended to be used to limit the scope of the claimed subject matter.

Additional features and advantages will be made apparent from the following detailed description that proceeds with reference to the accompanying drawings.

DESCRIPTION OF THE DRAWINGS

The following detailed description may be best understood when taken in conjunction with the accompanying drawings, of which.

DETAILED DESCRIPTION

Figure 1:
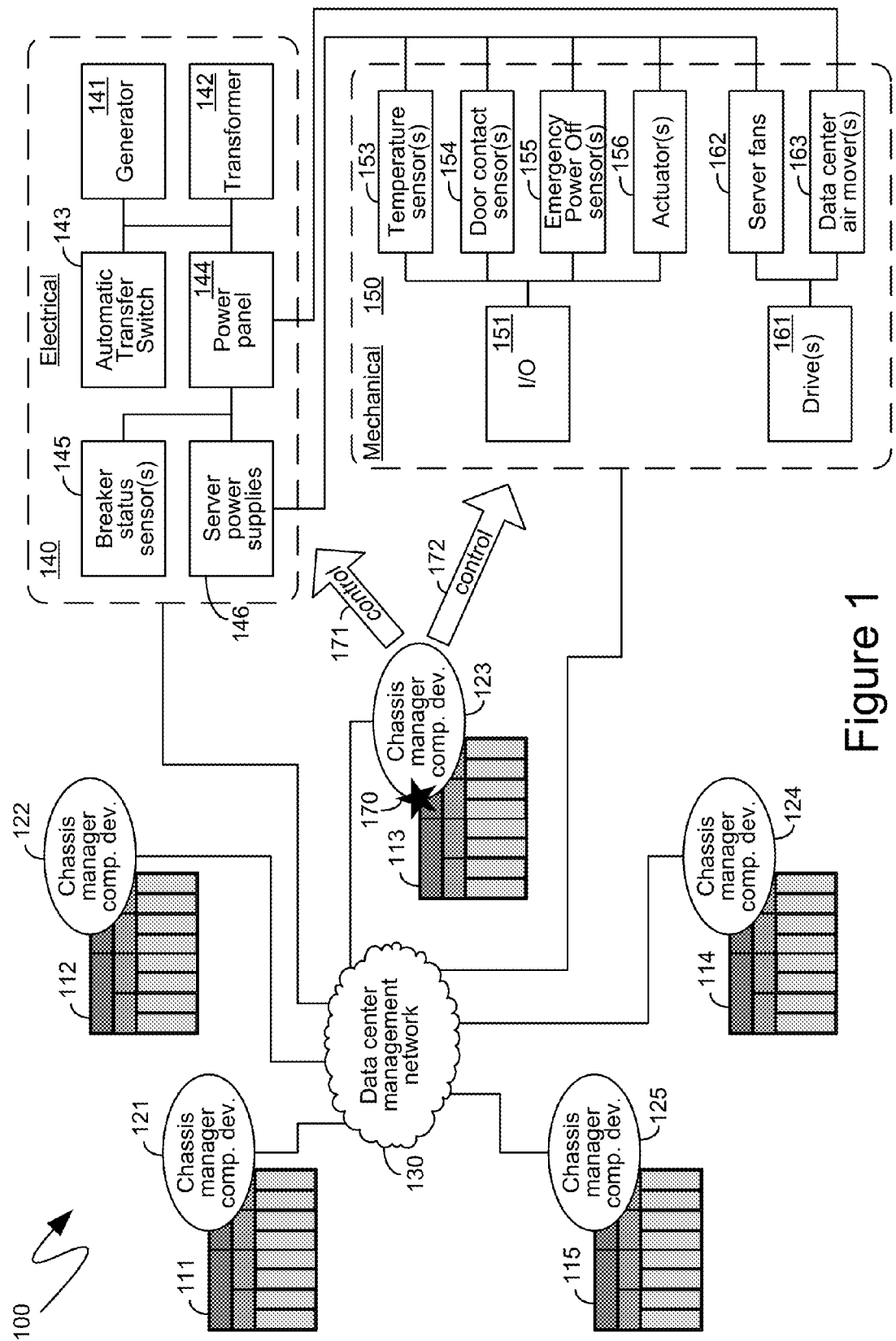
FIG. 1 is a component diagram of an exemplary system in which data center infrastructure devices are managed by existing data center computing devices.

The following description relates to the management of infrastructure devices, such as in a data center, by computing devices that are associated with the processing being provided by the data center to its customers. The management of infrastructure devices can be performed by the computing devices that are also performing the processing of the data center, or by the chassis manager computing devices that manage the chassis into which such computing devices are installed. In such a manner, no dedicated computing devices are required for the management of infrastructure devices, thereby reducing the cost and complexity of the data center, and providing infrastructure control computing devices that have greater redundancy and fault tolerance then would dedicated computing devices that would have been directed only to the management of infrastructure devices. Furthermore, because the computing devices associated with the processing provided by the data center can control that processing, providing for their control of infrastructure devices enables symbiotic decisions to be made and corresponding efficiencies to be realized. Multiple computing devices, such as chassis manager computing devices, can provide management of infrastructure devices by first selecting a master through known polling or consensus algorithms, and then subsequently endowing the master with the authority to manage infrastructure devices and generate the control output to such infrastructure devices. Alternatively, no master need be elected and, instead, output to such infrastructure devices is generated by a computing device selected utilizing polling or consensus algorithms, and is generated in accordance with a management decision made through polling or consensus algorithms. One aspect of the infrastructure devices that can be managed can be the interplay between the cooling apparatuses of individual server computing devices and the cooling apparatuses of the data center as a whole. Such management can seek to increase the portion of the cooling of server computing devices provided by data center air movers, and decrease the portion of the cooling of server computing devices provided by the individual cooling apparatuses of such server computing devices. The amount of power consumed by cooling devices in aggregate can, thereby, be decreased, due to the greater efficiency of data center air movers, as compared with individual server cooling apparatuses. Control of data center air movers can be determined empirically or predictively.

The techniques described herein make reference to specific types of equipment, namely specific types of computing hardware and specific types of infrastructure devices. For example, the descriptions are provided within the context of blade server computing devices installed in a server chassis, such as would typically be found in a data center environment, and where that server chassis, itself, comprises a chassis manager computing device. Such references, however, are strictly exemplary and are made for ease of description and presentation, and are not intended to limit the mechanisms described to specific devices. Instead, the techniques described herein are equally applicable, without modification, to any one or more computing devices and to any infrastructure hardware that provides a proper operating environment for such computing devices Although not required, aspects of the descriptions below will be provided in the general context of computer-executable instructions, such as program modules, being executed by a computing device. More specifically, aspects of the descriptions will reference acts and symbolic representations of operations that are performed by one or more computing devices or peripherals, unless indicated otherwise. As such, it will be understood that such acts and operations, which are at times referred to as being computer-executed, include the manipulation by a processing unit of electrical signals representing data in a structured form. This manipulation transforms the data or maintains it at locations in memory, which reconfigures or otherwise alters the operation of the computing device or peripherals in a manner well understood by those skilled in the art. The data structures where data is maintained are physical locations that have particular properties defined by the format of the data.

Generally, program modules include routines, programs, objects, components, data structures, and the like that perform particular tasks or implement particular abstract data types. Moreover, those skilled in the art will appreciate that the computing devices need not be limited to conventional server computing racks or conventional personal computers, and include other computing configurations, including handheld devices, multi-processor systems, microprocessor based or programmable consumer electronics, network PCs, minicomputers, mainframe computers, and the like. Similarly, the computing devices need not be limited to a stand-alone computing device, as the mechanisms may also be practiced in distributed computing environments linked through a communications network. In a distributed computing environment, program modules may be located in both local and remote memory storage devices.

With reference to FIG. 1, an exemplary system 100 is illustrated, such as might typically be found in a data center environment. Although the descriptions below will be in the context of such environments, as indicated previously, those of skill in the art will recognize that the descriptions are equally applicable to any other computing environments where is desirable for computing devices to control the infrastructure devices that maintain a proper operating environment for such computing devices. In the exemplary system 100 of FIG. 1, multiple blade server computing devices, storage devices, and the like are illustrated as being installed in one or more chassis such as the exemplary chassis 111, 112, 113, 114 and 115. Additionally, each such chassis is illustrated as comprising a chassis manager computing device, namely the exemplary chassis manager computing devices 121, 122, 123, 124 and 125, respectively. In one embodiment, the blade server computing devices installed in chassis, such as the exemplary chassis 111, 112, 113, 114 and 115, can provide the processing that the data center sells to its customers, also referred to herein as "the processing of the data center". By contrast, chassis manager computing devices, such as the exemplary chassis manager computing devices 121, 122, 123, 124 and 125, can provide processing directed to managing hardware and software components installed on the chassis and otherwise controlling such chassis hardware and software. For example, as will be recognized by those skilled in the art, chassis manager computing devices can keep track of the physical assets installed in the chassis, such as the serial numbers, model numbers, and other like information of the individual blade server computing devices, individual hard disks or other storage devices, and other like physical assets. As another example, and as will also be recognized by those skilled in the art, chassis manager computing devices can manage hardware aspects of the chassis such as, for example, insuring that the power supply is providing clean power at an appropriate voltage and current, controlling the speed and operation of the fans or other like cooling apparatuses, and managing other hardware aspects of the chassis.

The exemplary data center environment, of the exemplary system 100 of FIG. 1, also includes infrastructure devices that maintain a proper operating environment for the computing devices of the chassis installed in such a data center, such as the exemplary chassis 111, 112, 113, 114 and 115. Such infrastructure devices can include electrical infrastructure devices 140 and mechanical infrastructure devices 150. Among the electrical infrastructure devices 140 can be one or more transformers, such as the exemplary transformer 142, that can, for example, receive electrical power from a power grid and transform it into a form more easily distributed in, and utilized by, the data center. Electrical power can then be delivered from the transformer to a power panel, such as the exemplary power panel 144, from which it can be distributed to various components, subsystems and areas of the data center. For example, one type of component that can receive power from the power panel 144 can be the power supplies of the computing devices that provide the processing of the data center, such as the exemplary server power supplies 146 shown in FIG. 1. As will be recognized by those skilled in the art, power supplies for the sever computing devices providing the processing of the data center, such as the exemplary server power supplies 146, are typically co-located with such server computing devices. Thus, their illustration, in FIG. 1, as part of the electrical infrastructure devices 140 is meant only to illustrate their conceptual categorization, and not necessarily their physical location.

Typically, data centers comprise backup power sources, such as the exemplary generator 141, which can provide for electrical power if there is an interruption in the electrical power being provided by the power grid to the transformer 142. An automatic transfer switch 143 can automatically provide power, such as to the power panel 144, from the generator 141 once the automatic transfer switch 143 senses that electrical power is no longer being provided by the transformer 142. Additionally, one or more sensors, such as the exemplary breaker status sensors 145, can monitor the power panel 144 and detect improper operation of the power panel 144 or components thereof, such as individual breakers.

As will be recognized by those skilled in the art, the various electrical infrastructure devices 140 can provide input to, and can be controlled by, processes executing on one or more computing devices. For example, the breaker status sensors 145 can notify such processes of detected errors or anomalies in the power panel 144, or components thereof, such as individual breakers. As another example, the generator 141 can be instructed to activate even while electrical power from the electrical grid is still available through the transformer 142 for reasons that can include testing the generator 141, reducing consumption of electrical power from the electrical grid during periods of high cost, and other like reasons.

In addition to the electrical infrastructure devices 140, a data center, such as the exemplary data center environment represented by the system 100 of FIG. 1, can include mechanical infrastructure devices, such as the exemplary mechanical infrastructure devices 150. Among the exemplary mechanical infrastructure devices can be devices that cool the data center, or components thereof, such as the individual computing devices, to ensure that the heat, which is typically generated as part of the processing of data by such computing devices, is appropriately managed and does not cause such computing devices to operate sub-optimally, or even fail, due to overheating. Devices that provide cooling capability can include fans or other like cooling apparatuses that are co-located with individual server computing devices, such as exemplary server fans 162. In addition, data center air movers, such as the exemplary data center air movers 163, can provide cooling to whole rooms or spaces of the data center that can comprise many hundreds of the server computing devices. In one embodiment, the various fans, including the exemplary server fans 162, and the exemplary data center air movers 163, can be controlled by drive units that can convert computer control signals into a mechanical fan speed. Exemplary drive units 161 are, accordingly, illustrated in FIG. 1 and shown as part of the mechanical infrastructure devices 150.

Other mechanical infrastructure devices 150 that can be present in a data center environment, such as that illustrated by the exemplary system 100 of FIG. 1, can include temperature sensors, such as the exemplary temperature sensors 153, that can provide temperature information utilizable to control the temperature of the data center its components so as to prevent suboptimal operation of processing devices. Other sensors can include door contact sensors, such as the exemplary door contact sensors 154, which can provide notification of an open door, or other like potential security threat or climate control inefficiency, and emergency power off sensors, such as exemplary emergency power off sensors 155, which can detect losses of electrical power and can enable processing to be more gracefully transitioned or terminated if such an event is detected. Other various mechanical infrastructure devices 150 can include one or more actuators, such as exemplary actuators 156, which can control physical components, such as locks, gates, doors, panels and other like components. In one embodiment, sensors and actuators, such as the exemplary temperature sensors 153, door contact sensors 154, emergency power off sensors 155 and actuators 156, can receive control commands, and provide sensory feedback information, through one or more input/output devices such as the exemplary input-output devices 151.

In one embodiment, management and control of the infrastructure devices of the data center, such as the exemplary electrical infrastructure devices 140 and exemplary mechanical infrastructure devices 150, can be performed, not by dedicated computing devices, but rather by computing devices that are already associated with the processing being performed by the data center. In the exemplary system 100 of FIG. 1, such control of infrastructure devices is provided by the various chassis manager computing devices, such as the exemplary chassis manager computing devices 121, 122, 123, 124 and 125. In other embodiments, not specifically illustrated in FIG. 1, management and control of infrastructure devices can be provided by at least some of the server computing devices installed in the chassis of the data center, such as the exemplary chassis 111, 112, 113, 114 and 115. In such a manner, the control and management of infrastructure devices can be performed by computing devices that are already accounted for in the costs of the data center, thereby saving the additional expense that would be incurred in purchasing dedicated computing devices specifically for the control and management of infrastructure devices. In addition, by providing for the control and management of infrastructure devices utilizing computing devices that are already associated with the processing being performed by the data center, the inherent fault tolerance, redundancy, and backup provided to such computing devices automatically extends to the management and control of infrastructure devices.

A further benefit of utilizing computing devices associated with the processing performed by the data center to manage and control infrastructure devices can be the coordination between such infrastructure and the processing performed by the data center. More specifically, control and management of the infrastructure devices can be adjusted in accordance with the processing being performed by the data center and, conversely, processing being performed by the data center can be adjusted in accordance with the environment being provided by the infrastructure devices. For example, if the infrastructure devices, such as, for example, the breaker status sensors 145, indicate a problem with a particular breaker, than the computing devices managing and controlling such infrastructure devices, such as, for example, the chassis manager computing devices 121, 122, 123, 124 and 125 can reduce the processing being performed by server computing devices receiving power from that particular breaker, including throttling down the processing of such server computing devices, or moving the processing being performed by the server computing devices to other server computing devices receiving power from a breaker that is not affected. As another example, the chassis manager computing devices can time shift some of the processing being performed by the server computing devices to take advantage of fluctuations in the cost of power and can also control the electrical infrastructure devices 140, to, for example, transition to providing a greater amount of power from the generator 141 to further reduce the amount of grid power being consumed. As yet another example, if a decrease in processing is detected, then the computing devices managing the infrastructure devices can instruct cooling infrastructure devices, such as the data center air movers 163, to ramp down more quickly, thereby conserving energy by letting the overall temperature drop more slowly than otherwise would. While the above examples have been provided within the context of the chassis manager computing devices 121, 122, 123, 124 and 125 providing the management and control of the infrastructure devices, they are equally applicable to the server computing devices themselves providing the management and control of the infrastructure devices, or, indeed, any other computing device that has control over both the processing performed by the data center and over the infrastructure.

FIG. 1 illustrates an exemplary environment in which multiple computing devices, such as the multiple chassis manager computing devices 121, 122, 123, 124 and 125 collectively control and manage the infrastructure devices of the data center, such as the exemplary electrical infrastructure devices 140 and exemplary mechanical infrastructure devices 150, by electing a master computing device, which, in the exemplary system 100 that is illustrated in FIG. 1, can be the chassis manager computing device 123, as graphically represented by the star 170. In such an embodiment, the master computing device, such as the chassis manager computing device 123, can be the only computing device, from among the other computing devices tasked to control and manage the infrastructure devices, which can generate control output, such as the exemplary control output 171 and 172 to the infrastructure devices. More specifically, each of the computing devices tasked with controlling and managing the infrastructure devices, such as, for example, the chassis manager computing devices 121, 122, 123, 124 and 125, can receive information and output from those infrastructure devices, such as the exemplary electrical infrastructure devices 140 and exemplary mechanical infrastructure devices 150. However, the determination of how to control and manage such infrastructure devices, and the generation of corresponding control and management output, such as the exemplary control output 171 and 172, can be performed entirely by the master computing device, such as the chassis manager computing device 123. In instances where control of the infrastructure devices is integrated with control of the processing being performed by the data center, the master computing device can poll the other computing devices, such as the chassis manager computing devices 121, 122, 124 and 125, to obtain there from information regarding the processing being performed by the server computing devices in the chassis 111, 112, 114 and 115, respectively. The master computing device, namely the chassis manager computing device 123 in the present illustrated example, can then generate corresponding control and management output, including control and management output to the infrastructure devices, is illustrated by the exemplary control output 171 172, and control and management output to the other chassis computing devices to enable control the processing being performer the data center to work in concert with the environment being provided by the infrastructure devices, such as detailed above.

A master computing device can retain its master status so long as it continues proper operation. Thus, in one embodiment, a master computing device can, periodically, transmit messages to its peer computing devices, informing them that the master computing device remains properly operational. Such messages are often referred to, by those skilled in the art, as "heartbeat messages". Thus, in the exemplary system 100 that is shown in FIG. 1, so long as the chassis manager computing device 123 continues to transmit heartbeat messages to the other chassis manager computing devices, namely the chassis manager computing devices 121, 122, 124 and 125, then those other chassis manager computing devices will allow the chassis manager computing device 123 to continue to act as the master computing device and, thereby, itself implement management and control of the infrastructure devices of the data center.

If, however, a heartbeat message is not received by one or more of the chassis manager computing devices that are not currently the master computing device, such as, for example, the chassis manager computing devices 121, 122, 124 and 125, within a predefined amount of time, then such a chassis manager computing device can initiate the selection of a new master. The predetermined amount of time can be based on the periodicity at which such heartbeat messages are sent, and can be sufficiently long such that the mere absence of one heartbeat message is insufficient to trigger the selection of a new master computing. However, if multiple heartbeat messages were expected and not received, then the selection of a new master computing device can be triggered.

The selection of a new master computing device can be based on voting among the remaining computing devices, such as, for example, the chassis manager computing devices 121, 122, 124 and 125. When all of such computing devices, or a majority of such computing devices, agree on a new master computing device, that computing device can become the new master computing device and it can send heartbeat messages until it experiences a failure. Such a new master computing device can, like the old master computing device, also be the computing device that determines how to appropriately manage such infrastructure devices, and that generates and transmits the control output to such infrastructure devices.

In one embodiment, the computing devices tasked with managing the infrastructure devices, such as in a data center, can implement a consensus protocol for determining which of those computing devices is to act as a master computing device. As will be recognized by those skilled in the art, appropriate consensus protocols provide for master selection, as well as for fault recovery. More specifically, when a computing device that has failed is subsequently restored to a properly operating condition, it can learn of a current master computing device, and can then participate in the consensus going forward, in accordance with the fault recovery mechanisms of whatever consensus protocol is being implemented.

In another embodiment, the computing devices tasked with managing and controlling infrastructure devices can utilize a consensus protocol to jointly manage and control such infrastructure devices. Thus, in such another embodiment, there need not be a specific computing device that is selected as a master computing device, and control output, such as the exemplary control output 171 and 172, can be generated by any of the computing devices. More specifically, and as described previously, each of the chassis manager computing devices 121, 122, 123, 124 and 125 can receive input and information relevant to the control of infrastructure devices. For example, each of the chassis manager computing devices 121, 122, 123, 124 and 125 can receive input, such as from one or more of the temperature sensors 153, indicating that additional cooling is desirable. In response, one of the chassis manager computing devices 121, 122, 123, 124 and 125 can suggest a control operation comprising an increase in the speed of the data center air movers 163. The remaining chassis manager computing devices can vote on such a control operation, in a manner consistent with the consensus protocol being implemented. Additionally, the chassis manager computing devices can select a specific one of the chassis manager computing devices to generate such control output, again, in a manner consistent with the consensus protocol being implemented. Thus, if, for example, the chassis manager computing devices 121, 122, 123, 124 and 125, utilizing the consensus protocol that is being implemented, determine that an appropriate response is to increase the speed of the data center air movers 163, and determine that the chassis manager computing device 123 is to generate such a control output to trigger the increase the speed of the data center air movers 163, then the chassis manager computing device 123 can generate such a control output, such as the exemplary control output 172, and can, thereby, increase the speed of the data center air movers 163.

A subsequent control output to be generated can, likewise, be generated among all of the chassis manager computing devices 121, 122, 123, 124 and 125 in accordance with the consensus protocol being implemented. Thus, for example, the subsequent control output may not necessarily be transmitted by the same chassis manager computing device 123 that transmitted the prior control output. Furthermore, if one or more of the chassis manager computing devices 121, 122, 123, 124 and 125 were to fail, the remaining ones of the chassis manager computing devices could continue to implement the consensus protocol and appropriately control the infrastructure devices. In such a manner, management and control of infrastructure devices can be implemented with redundancy and fault tolerance levels that are at least as great as the redundancy and fault tolerance levels associated with the computing devices performing the processing of the data center.

To enable computing devices, such as the exemplary chassis manager computing devices 121, 122, 123, 124 and 125, to communicate with, and, thereby, control and manage, the infrastructure devices of a data center, such infrastructure devices can be communicationally coupled with a network, such as the network 130, to which the chassis manager computing devices 121, 122, 123, 124 and 125 are also communicationally coupled. More specifically, and as will be recognized by those skilled in the art, the chassis manager computing devices 121, 122, 123, 124 and 125 are typically communicationally coupled to one another through a network, such as the exemplary data center management network 130, shown in the system 100 of FIG. 1. Such an exemplary data center management network 130 can be a separate physical network from the network to which the server computing devices that perform the processing of the data center can be coupled, or it can share the same networking hardware and infrastructure, except be separated through logical mechanisms, such as different sub-network identifiers, different communicational protocols, and the like. To enable the chassis manager computing devices 121, 122, 123, 124 and 125 to manage and control the infrastructure devices, such as the exemplary electrical infrastructure devices 140 and exemplary mechanical infrastructure devices 150, those infrastructure devices can be communicationally coupled with the data center management network 130. Such communicational coupling can entail a physical connection between the infrastructure devices the network hardware devices that implement the data center management network 130, a logical communicational coupling by which the communicational attributes of the various infrastructure devices are set in accordance with the communicational attributes of the data center management network 130, or combinations thereof.

Figure 2:
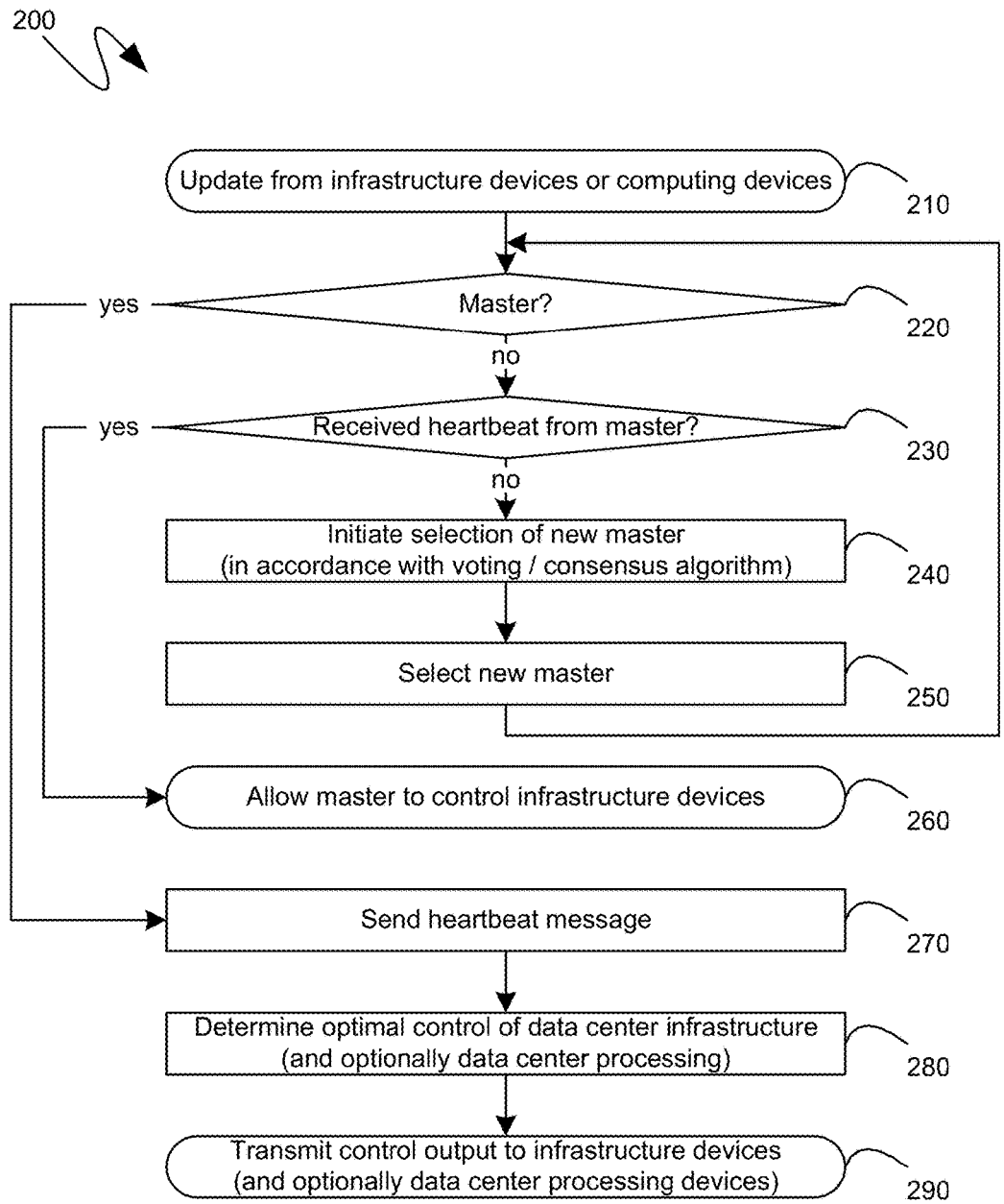
FIG. 2 is a flow diagram of an exemplary management of data center infrastructure devices by existing data center computing devices.

Turning to FIG. 2, the flow diagram 200 shown therein illustrates an exemplary series of steps by which a set of computing devices such as, for example, the chassis manager computing devices referenced above, can manage and control infrastructure devices, such as of a data center. The exemplary flow diagram 200 comprises an exemplary series of steps by which such management and control can be accomplished through a master computing device. For purposes of illustration, exemplary flow diagram 200 commences, at step 210, with the receipt of information, or an update, from one or more infrastructure devices or from one or more of the computing devices associated with the processing of the data center. As will be recognized by those skilled in the art, however, and as will be explicitly indicated below, many of the steps of the flow diagram 200 need not be performed only in response to received communications, and can, instead, be performed based on orthogonal trigger conditions such as, for example, the passage of time.

Returning back to the exemplary flow diagram 200, at step 220, a determination can be made as to whether the computing device performing functions of the exemplary flow diagram 200 is a master computing device. If, at step 220, the computing device performing the functions of the exemplary flow diagram 200 determines that it is not a master computing device, then processing can proceed to step 230, where such a computing device can verify that it has received a heartbeat communication from the master computing device within a predetermined amount of time. The predetermined amount of time, as will recognized by those skilled in the art, can be based on the periodicity at which such heartbeat communications are to be transmitted. Thus, for example, if such heartbeat communications are to be transmitted once a minute, then within any sixty second span of time, at least one such heartbeat communication should have been received. In one embodiment, the predetermined amount of time can be set so that merely missing one heartbeat communication does not trigger steps 240 and 250, so as to avoid the performance of such steps needlessly. Thus, returning to the above example where heartbeat communications are transmitted once a minute, the predetermined period of time could be set to two or three minutes such that at least two or three such heartbeat communications would need to not be received in order to trigger steps 240 and 250.

If, at step 230, it is determined that a heartbeat communication has been received from a master computing device within a predetermined amount of time, then the computing device performing the steps of the exemplary flow diagram 200 of FIG. 2, can determine that it is not the master computing device and that a valid and operational master computing device exists and, consequently, processing can proceed with step 260 where such a computing device allows the master computing device to control the infrastructure devices. However, if, at step 230, it is determined that a heartbeat communication has not been received from the master computing device within a predetermined amount of time, then the computing device performing the steps of the exemplary flow diagram 200 can initiate the selection of a new master computing device. Such a selection can occur in accordance with the voting or consensus algorithm being implemented by the computing devices tasked with managing and controlling the infrastructure devices. For example, in one embodiment, a simple voting protocol can be utilized to select a new master computing device. In other embodiments, more complicated consensus outcomes can be utilized that can account for lost messages, failures, maliciousness and other like events. Once the selection of a new master computing device is initiated, at step 240, processing can proceed to step 250, where the computing device executing the steps of the exemplary flow diagram 200 can participate with its peer computing devices to select a new master computing device. Processing can then return to step 220, where such a computing device can determine whether it has been selected as the master computing device.

If, at step 220, a computing device determines that it is the current master computing device, then it can generate control output to one or more data center infrastructure devices, and it can also generate heartbeat communications. As indicated previously, the transmission of heartbeat communications can occur on a set periodicity and, as such, need not be dependent upon anything other than the passage of time, such as the receipt of information illustrated at step 210. Similarly, the passage of time, or other like triggers, can trigger a computing device to determine that control output should be generated and transmitted to one or more infrastructure devices and, as such, the generation and transmission of such control output to infrastructure devices is, also, not dependent upon the receipt of information at step 210. Thus, while the exemplary flow diagram 200 of FIG. 2 illustrates one set of steps that can be performed, such as in response to the receipt of information, it is not meant to indicate that the steps illustrated can only be performed in response is such a triggering event.

Thus, at step 270, a master computing device can transmit a heartbeat communication on a given periodicity. Additionally, at step 280, a master computing device can determine optimal control of data center infrastructure devices. Such optimal control can include coordinating between data center infrastructure devices and the computing devices that provide the processing of the data center. For example, if the data center has a reduced processing load, then, in one embodiment, optimal control of the data center infrastructure, such as can be determined at step 280 by the master computing device, can include determining that the data center infrastructure should deactivate electrical power to certain portions of the data center into the processing being performed by the computing devices in those portions can be transferred to other computing devices in portions of the data center that are to remain with electrical power. Thus, in such an example, the transmission of control output to infrastructure devices, at step 290, can include instructions provided to, for example, an electrical power distribution system to deactivate electrical power to defined portions of the data center. In such an example, control output, generated and transmitted at step 290, can also include generating and transmitting instructions to transfer processing being performed by computing devices in those portions of the data center that are to be activated to computing devices in those portions of the data center that are to remain with electrical power. As will be recognized by those skilled in the art, the instructions to transfer processing can be directed to the data center processing devices themselves, such as the server computing devices installed in to chassis, or to management computing devices such as, for example, the chassis manager computing devices.

As part of the determination, at step 280, of optimal control of data center infrastructure, the master computing device can also poll, or otherwise request or receive information from computing devices associated with the processing being performed by the data center. For example, through information received from such computing devices, it can be determined that the processing being performed by the data center has decreased. As will be recognized by those skilled in the art, such a decrease can result in a reduction in the amount of cooling required, although such a reduction in the amount of cooling can be delayed due to the need to first remove at least a portion of the heat that was generated by prior processing. Thus, in one embodiment, upon receiving such information, the master computing device can determine, such as at step 280, that an optimal control of data center infrastructure includes reducing the cooling being provided by cooling apparatuses, such as by reducing the speed of data center air movers, since such an operation can save energy with only minimal negative impact, namely a delayed decrease in temperature. Subsequently, at step 290, control output to relevant infrastructure devices, such as the data center air movers, can be generated and transmitted, causing those air movers to decrease their speed, or otherwise decrease the cooling they provide.

Figure 3:
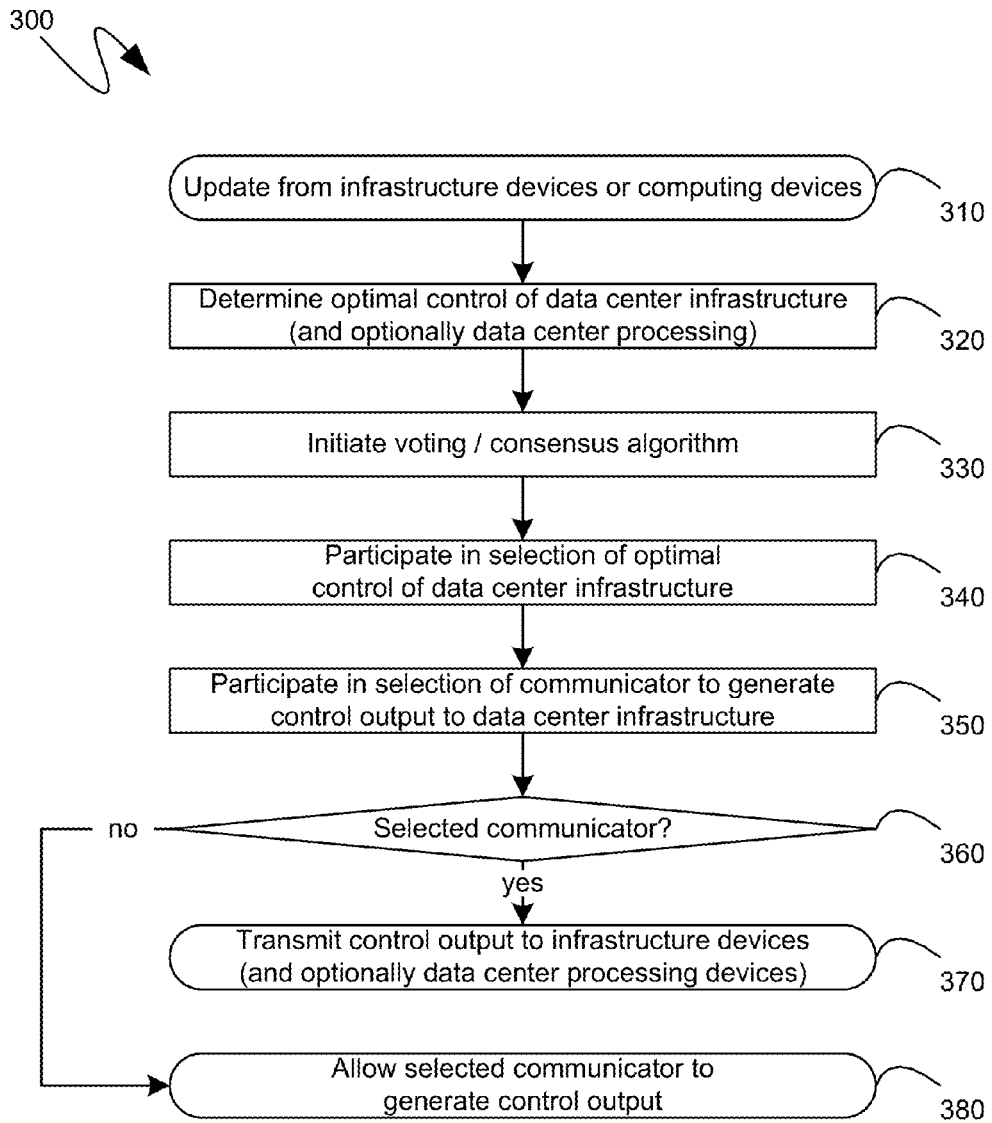
FIG. 3 is a flow diagram of another exemplary management of data center infrastructure devices by existing data center computing devices.

Before proceeding with FIG. 3, the above-described embodiments, in which a master computing device can be selected from among two or more peer computing devices, can, in some embodiments, be implemented in a hierarchical fashion. For example, the chassis manager computing devices of chassis on a single rack, or chassis in a defined area of the data center, can act as peers to select a single master computing device. That selected master computing device, a "first level" master computing device, can then act as a peer with other first level master computing devices, such as could be selected from among chassis manager computing devices on a different racks, or from among chassis manager computing devices in a different area of the data center, to, among themselves, select a "second level" master computing device. Further hierarchical levels can, in an analogous manner, also be implemented.

Turning to FIG. 3, the flow diagram 300 shown therein illustrates an exemplary series of steps by which a set of computing devices such as, for example, the chassis manager computing devices referenced above, can manage and control infrastructure devices, such as those of a data center. The exemplary flow diagram 300 comprises an exemplary series of steps by which such management and control can be accomplished through achieving consensus among a collection of such computing devices, and without the need for a single master computing device. As with the exemplary flow diagram 200 described above, the exemplary flow diagram 300 of FIG. 3 commences, at step 310, with the receipt of information, or an update, from one or more infrastructure devices or from one or more of the computing devices associated with the processing of the data center. And, as with the exemplary flow diagram 200 described above, such a commencement is for illustrative purposes and is not meant to illustrate that the succeeding steps can only be performed responsive to such receipt of information.

Subsequently, rather than delegating to a master computing device, in one embodiment, optimal control of the data center infrastructure, data center processing, or combinations thereof can be determined by one or more individual computing devices as part of the step 320. At step 330, one or more such computing devices can initiate a voting or other utilization of a consensus algorithm, in order to decide, as a group, how to control the data center infrastructure, data center processing, or combinations thereof. At step 340, one or more such computing devices can participate in the selection of an optimal control. More specifically, the computing device executing the steps of the exemplary flow diagram 300 can, at step 340, suggest to the other computing devices that they adopt the optimal control determined by such a computing device at step 320. Subsequently, through the voting protocol, or consensus algorithm, implemented, the computing device executing steps of the exemplary flow diagram 300 can learn of the control that was selected.

The computing devices participating in the voting consensus algorithm can, likewise, select a communicator computing device to issue the control instructions, such as to infrastructure devices. The participation, by the computing device executing the steps of the exemplary flow diagram 300, in such a selection process, is illustrated at step 350. Subsequently, at step 360, a determination can be made as to whether the computing device executing the steps of the exemplary flow diagram 300 was the computing device that was selected to act as the communicator. If it was not selected to act as a communicator, as determined at step 360, then processing can proceed to step 380, where such a computing device can allow the selected communicator computing device to generate the relevant control output. Conversely, if, at step 360, the computing device executing the steps of the exemplary flow diagram 300 of FIG. 3 was, in fact, selected as the computing device to communicate the selected control, such as to the infrastructure devices, then processing can proceed to step 370, where such control output can be generated and transmitted, including to infrastructure devices, data center processing devices, or combinations thereof. As before, the mechanisms described herein provide for unified control of both data center infrastructure devices and data center processing devices.

Figure 4:
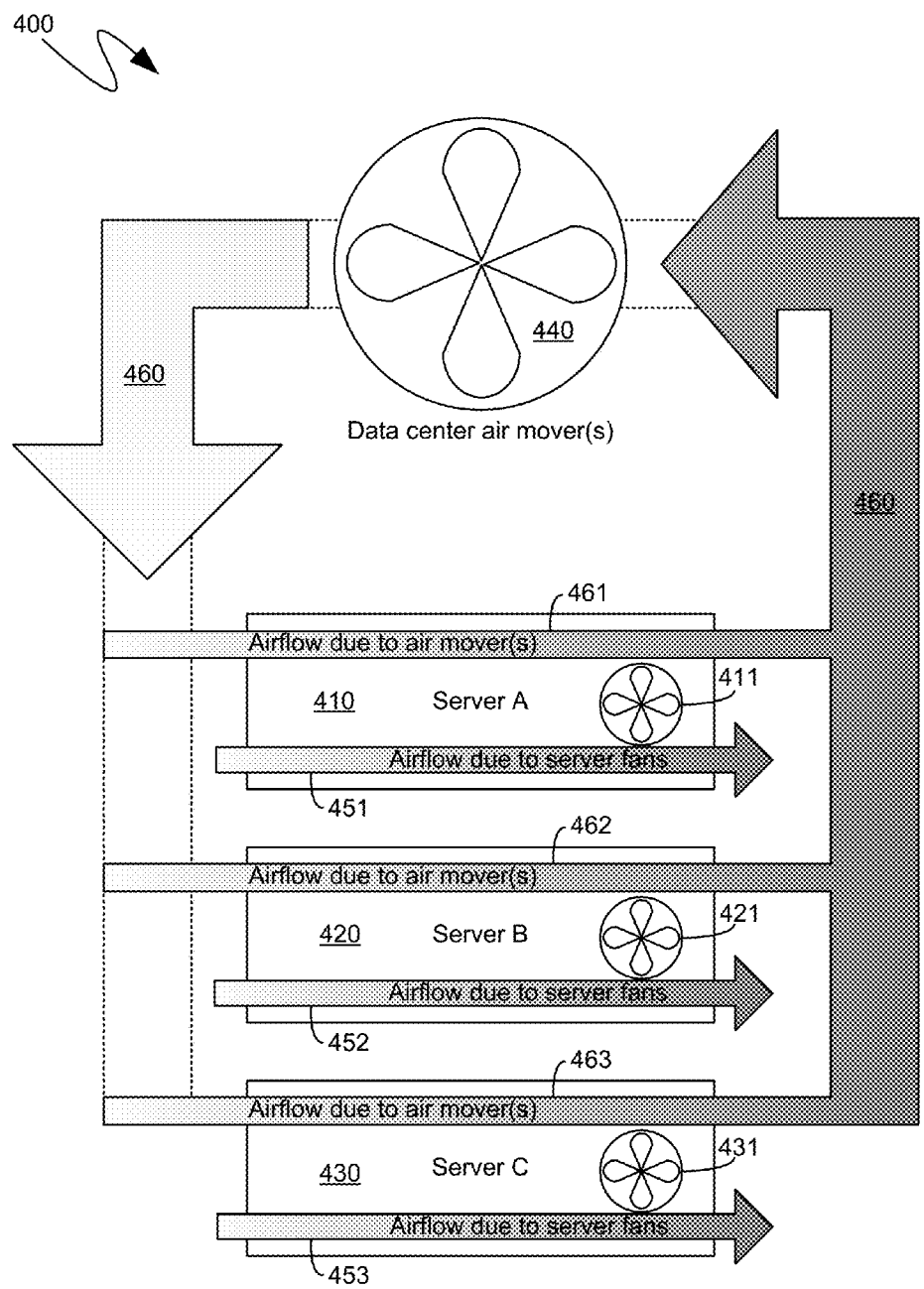
FIG. 4 is a component diagram of an exemplary interplay between data center air movers and individual server computing device fans.

Turning to FIG. 4, the system 400 shown therein provides context for the descriptions below regarding one exemplary control of infrastructure devices that can be implemented by the aforementioned computing devices associated with the processing of the data center. More specifically, exemplary system 400 of FIG. 4 illustrates cooling airflow, such as can be provided by individual server fans, as well as by larger data center air movers that can provide cooling airflow, not to specific computing devices, but rather to whole areas of the data center. For example, the exemplary system 400 of FIG. 4 illustrates three exemplary server computing devices, namely the exemplary server computing devices 410, 420 and 430. Each of the exemplary server computing devices 410, 420 and 430 can perform processing that can result in the processing components of such server computing devices requiring cooling, such as via airflow through such server computing devices and across such processing components.

In one embodiment, each of the server computing devices 410, 420 and 430 can comprise one or more fans, such as the exemplary fans 411, 421 and 431, respectively. The exemplary fans 411, 421 and 431 can generate airflow through the server computing devices 410, 420 and 430, respectively, as illustrated by the airflow 451, 452 and 453, respectively. In a further embodiment, each of the server computing devices 410, 420 and 430 can also be cooled by air flowing through such server computing devices due to the operation of one or more data center air movers, such as the exemplary data center air movers 440 shown in the system 400 of FIG. 4. More specifically, and as will be recognized by those skilled in the art, datacenters air movers, such as exemplary data center air movers 440, can cause air pressure differentials by, for example, increasing the air pressure on the left-hand side of the server computing devices 410, 420 and 430 (as viewed in FIG. 4), and, correspondingly decreasing the air pressure on the right-hand side of the server computing devices (again, as viewed in FIG. 4). Such an air pressure differential can result in airflow through the server computing devices 410, 420 and 430, such as in the form of the airflow 461, 462 and 463, respectively. As illustrated in the exemplary system 400 of FIG. 4, the airflow 461, 462 and 463 can be part of the greater airflow 460 generated by the data center air movers 440.

Thus, as can be seen from the illustration of FIG. 4, the cooling of the processing components in server computing devices such as, for example, the exemplary server computing devices 410, 420 and 430, can be provided by a combination of the airflow due to the server fans of such computing devices, such as, for example, the exemplary server fans 411, 421 431, and the airflow due to the air movers of the data center in which such server computing devices are located, such as, for example, the exemplary data center air movers 440. As will be recognized by those skilled in the art, data center air movers can be more efficient than individual server fans, because data center air movers, being typically larger than individual server fans, can move a greater volume of air while consuming a lesser amount of electrical power. Conversely, because data center air movers can be substantially larger than individual server fans, disregarding be amount of air actually moved, a single individual server fan overall consumes less power then the larger data center air movers. Thus, there may be instances in which it can be more economical to cool one or more server computing devices with airflow generated primarily by data center air movers, instead of airflow generated primarily by server fans, and, likewise, there may be instances in which it can be more economical to cool one or more server computing devices with airflow generated primarily by server fans instead of by data center air movers. Consequently, the aforementioned control mechanisms can be utilized to optimize the aggregate power consumption of the various cooling apparatuses, such as data center air movers and server fans, by shifting the cooling responsibilities between them under appropriate circumstances period Turning to FIG. 5, the exemplary graph 500 shown therein illustrates an exemplary power consumption of various cooling apparatuses, such as server fans, data center air movers, and the like. For purposes of illustration, the server fans power consumption 520, which can represent an aggregate power consumption of a collection of server fans across multiple server computing devices, and transition upward at time 541. Such an upward increase in the server fans aggregate power consumption 520 can be triggered by, for example, one or more server computing devices transitioning their fans from a lower speed and, thus, a lower power consumption, to a higher speed and, thus, a higher power consumption. Such another upward increase in the server fans aggregate power consumption 520 can, likewise, occur at times 542, 543 and 544 as other server computing devices transition their fans from a lower speed to higher speed.

In one embodiment, with the upward increase in the server fans aggregate power consumption 520, at the time 544, a determination can be made that the aggregate cooling power consumption 550 would decline if the data center air movers were increased to a higher speed and, thus, a higher rate of cooling. More specifically, such an increase in airflow attributable to the data center air movers can enable individual server computing devices to decrease the speed of their fans, thereby saving power in the aggregate. For example, as illustrated by the exemplary graph 500 of FIG. 5, at a time 545, data center air mover power consumption 510 can increase due to the operation of such data center air movers at a higher rate of speed. After a period of time, due to the increased airflow and cooling provided by the increased data center air mover speed, the power consumption of server fans can decrease. More specifically, in the embodiment illustrated by the exemplary graph 500 of FIG. 5, each of the individual server fans that had been transitioned to a higher speed at times 541, 542, 543 and 544 can, at time 546, in response to the increase in cooling provided by the data center air movers, commencing at time 545, decrease to a lower speed, such as a speed that those individual server fans had at a time prior to time 541. Thus, as illustrated, at a time 546, after the time 545 at which the data center air movers were increased a higher rate of speed, the server fan aggregate power consumption 520 can decrease. As a result, the aggregate cooling power consumption 550 after the time 546 can be less than the aggregate cooling power consumption 550 prior to time 545 when the data center air movers were transitioned to higher-speed operation and increased cooling.

Figure 5:
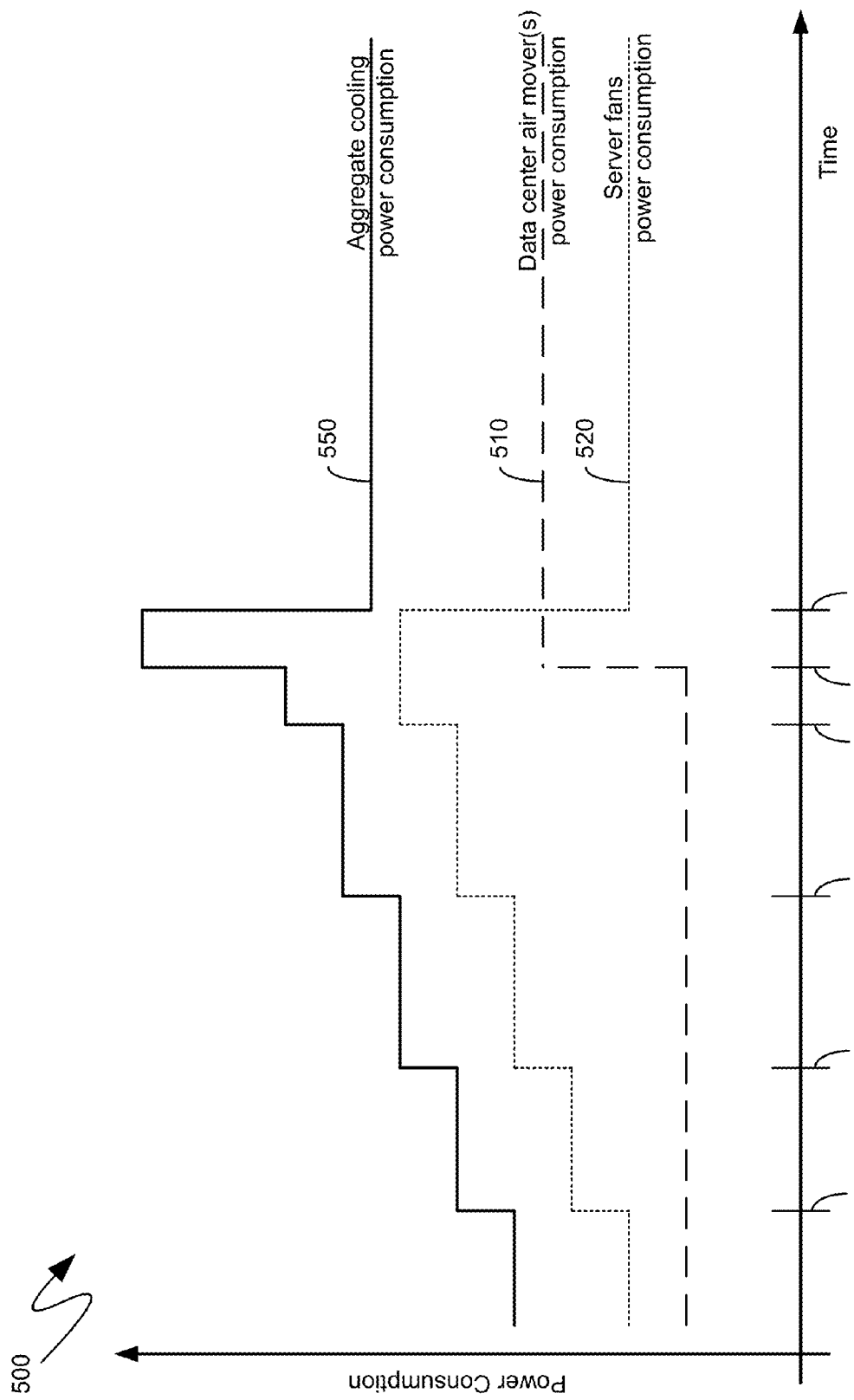
FIG. 5 is a graph diagram of an exemplary reduction of power consumed by cooling devices in aggregate.

By way of a specific example, and with reference to both FIG. 4 and FIG. 5, at time 542, the exemplary server computing device 410 can, as part of the present specific example, increase the speed of its fan 411. Such an increase can result in the fan 411 consuming an extra 3 W of power, for example, and, thus, the server fans aggregate power consumption 520, can increase by 3 W. At the time 542, in the present example, the server computing device 410 can be the only computing device, from among the other server computing devices 420 and 430, that can require such additional cooling. Thus, consequently, at the time 542, it may not be efficient to increase the speed of the data center air movers 440, since a speed increase in the data center air movers 440 can, for purposes of the present example, consume 8 W, which is greater than the 3 W consumed by increasing onlt the speed of the sever fan 411 by itself. Subsequently, at the time 543, the exemplary server computing device 420 can increase the speed of its fan 421 because, in the present example, at the time 543, the exemplary server computing device 420 can also require increased cooling. Thus, at the time 543, an additional 3 W can be consumed by increasing the speed of the fan 411, resulting in a server fans aggregate power consumption 520 increase of 6 W when compared with the server fans aggregate power consumption 520 prior to the time 542. However, since increasing the speed of the data center air movers 440 can, in the present example, consume 8 W, it can still be more efficient to leave the data center air movers 440 operating at their present speed. However, at the time 545, the exemplary server computing device 430 can increase the speed of its fan 431 and, as a result, the server fans aggregate power consumption 420 can increase by another 3 W, such that an increase of 9 W can have been observed since prior to the time 542. Consequently, if increasing the speed of the data center air movers 440 can result in each of the fans 411, 421 and 431 decreasing their speed, and, thereby, reducing their power consumption by 3 W each, or 9 W in aggregate, then the 8 W increase in the power consumption of the data center air movers 440 can still result in a net 1 W decrease in the aggregate cooling power consumption 550. Consequently, at time 545, the data center air movers 440 can have their speed increased, which can, as explained previously, result in a corresponding decrease the speed of the server fans 411, 421 and 431 and, thus, the server fans aggregate power consumption 520, at time 546.

Aggregate cooling power consumption 550 can equally be reduced when cooling needs are lessened by, for example, reducing the speed of the data center air movers 440 even if such a reduction can result in at least some of the server computing devices 410, 420 and 430 having to increase the speed of their fans 411, 421 and 431, respectively. For example, if the processing performed by the exemplary server computing device 430 decreases, then the decrease in the speed of the data center air movers 440 would not cause the server computing device 430 to have to increase the speed of its fan 431, since it no longer needs such increased cooling. In such an instance, the speed of the data center air movers 440 can be decreased, saving 8 W of energy consumption. Such a decrease in the speed of the data center air movers 440 can, however, cause the exemplary server computing devices 410 and 420, in the present example, to increase the speed of their server fans 411 and 421, respectively, since the exemplary server computing devices 410 and 420 can not have experienced the same sort of processing decrease as the exemplary server computing device 430, and, as such, the exemplary server computing devices 410 and 420 can require more cooling than the reduced speed of the data center air movers 440 will now be able to provide; cooling that can be provided by increasing the speed of their server fans 411 and 421, respectively. Nevertheless, the increase in the speed of the server fans 411 and 421 can result, in the present example, in only an additional 6 W of aggregate power consumption by the server fans. Consequently, the decrease in the speed of the data center air movers 440 can result in a net decrease of 2 W of energy consumption of the cooling apparatuses in aggregate.

Figure 6:
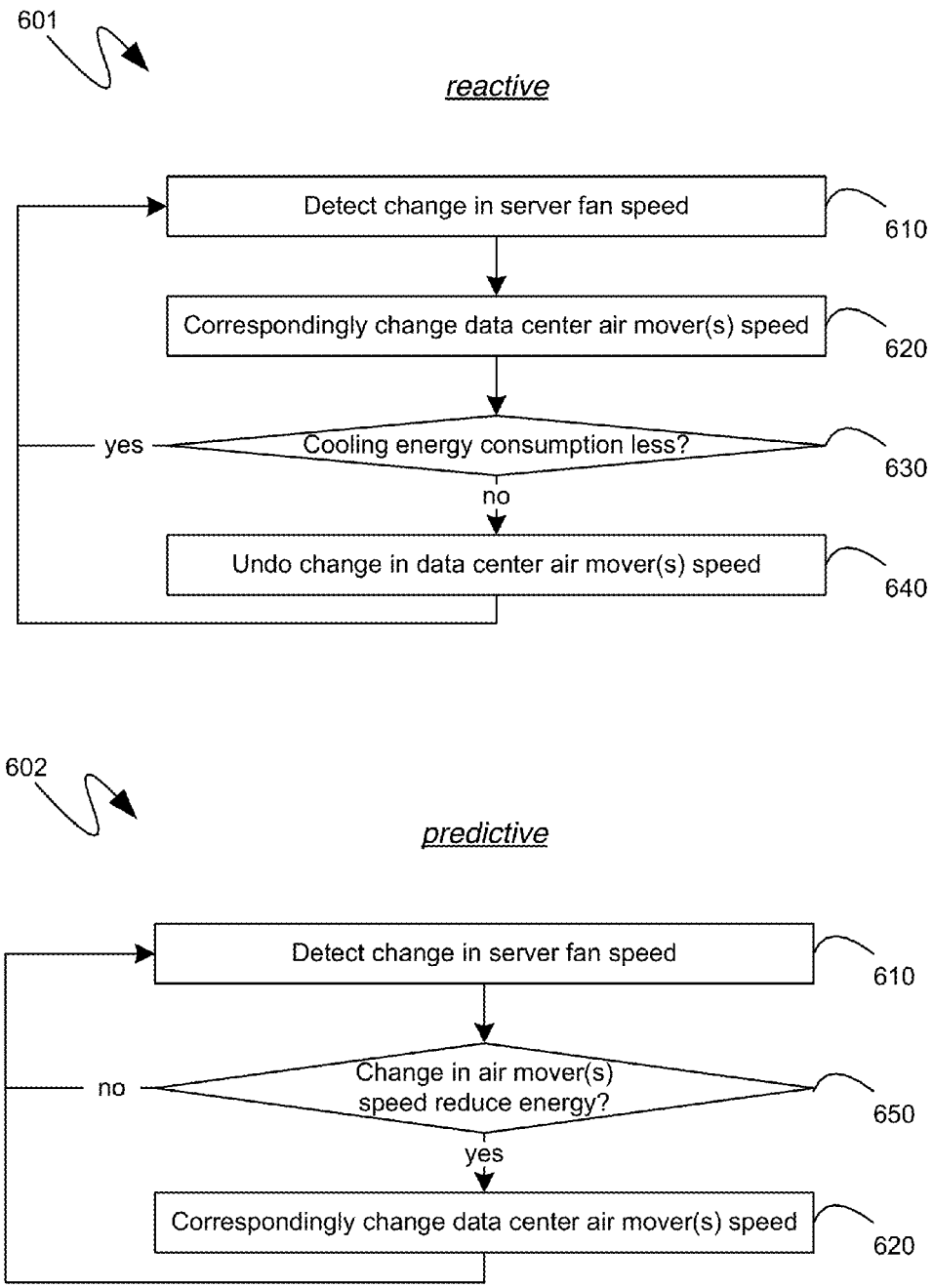
FIG. 6 is a flow diagram of an exemplary management of data center air movers.

Turning to FIG. 6, the exemplary flow diagrams 601 and 602 illustrate alternative embodiments for determining the amount of cooling to be provided by cooling apparatuses such as, for example, the data center air movers 440, shown in FIG. 4. More specifically, the exemplary flow diagram 601 illustrates an exemplary series of steps that seek to reduce the power consumption of the cooling apparatuses, in aggregate, based upon a reactive, empirical approach. By contrast, the exemplary flow diagram 602 illustrates an exemplary series of steps that seek to reduce the power consumption of the cooling apparatuses, in aggregate, based upon a predictive, calculated approach.

Turning first to the exemplary flow diagram 601, at step 610 a change in the speed of one or more server fans can be detected. Subsequently, at step 620, a corresponding change in the speed of one or more data center air movers can be performed. Thus, for example, if the change that is detected, at step 610, is an increase in the speed of one or more server fans and then, at step 620, the speed of one or more data center air movers can, correspondingly, be increased. At step 630, a determination can be made as to whether the change in the amount of cooling provided by the data center air mover, at step 620, resulted in the aggregate energy consumed by all cooling apparatuses decreasing. If, at step 630, it is determined that no such decrease occurred in the amount of energy consumed by all of the cooling apparatuses, in aggregate, and, instead, that such aggregate cooling power consumption either stayed the same or increased, then, at step 640, the change in the data center air mover speed that was performed at step 620 can be undone. Thus, for example, if, at step 620, the speed of one or more data center air movers was increased then, should step 640 need to be performed, the speed of the one or more data center air movers that was increased can, at step 640, be decreased back to the prior speed. Conversely, if, at step 630, it is determined that the aggregate energy consumed by the cooling apparatuses has decreased, then processing can return to step 610, and the data center air movers can remain operational in their changed state, since such a change state resulted in a decrease in the aggregate cooling power consumption.

Turning to the exemplary flow diagram 602, for ease of reference and understanding, steps that are identical in both the exemplary flow diagram 601 and the exemplary flow diagram 602 have been assigned the same numbers. Thus, for example, exemplary flow diagram 602 commences with the detection of a change in the fan speed of one or more server fans, at step 610, which was described in detail above. Likewise, exemplary flow diagram 602 comprises the step 620, at which a corresponding change in data center air mover speed can be made, which was also described in detail above. As can be seen, though, a difference between the exemplary flow diagram 601, described in detail above, and the exemplary flow diagram 602, can be the presence of step 650 between the step 610 and 620. More specifically, in the exemplary flow diagram 602, prior to correspondingly changing a data center air mover speed, at step 620, a determination can first be made, at step 650, as to whether such a change in the data center air mover speed would be predicted to reduce the aggregate power consumption of all of the cooling apparatuses, combined. If, at step 650, it is predicted that a corresponding change in the data center air mover speed will not actually reduce aggregate cooling power consumption, then processing can return to step 610 without performing step 620 and without correspondingly changing the data center air mover speed. Conversely, if at step 650, it is predicted that a corresponding change in the data center air mover speed can reduce the aggregate cooling power consumption, then can processing proceed to step 620. Once step 620 is performed, processing can return to step 610. As can be seen, in the exemplary flow diagram 602, a responsive increase or decrease in the data center air mover speed, at step 620, which can be responsive to a detected change in individual server fan speeds, at step 610, and be conditioned on the energy savings prediction of step 650, such that, if, at step 650, no aggregate cooling power consumption reduction is predicted, then there is no change made to the data center air mover speed.

For purposes of predicting, at step 650, whether the speed of the data center air movers should be changed, reference can be made to empirical data, theoretical calculations, or combinations thereof. For example, empirical data can be collected that correlates data center air mover speeds with the cooling effect at each individual server. As another example, theoretical calculations can estimate an airflow increase, at a server, caused by an increase in the speed of the fans at that server, as well as an estimate of an airflow increase, at that same server, that would be caused by an increase in the speed of the data center air movers. In one embodiment, the prediction, at step 650, can be based on the individual status of one or more server computing devices, including, for example, the speed at which the fans of those individual server computing devices are currently operating, the temperatures of the various components, such as processing components, of those individual server computing devices, and other like status information. Such information can then be utilized, together with the empirical or theoretical determinations described above, to make the prediction, at step 650, as to whether a change in the speed of the data center air movers would, in fact, reduce the aggregate energy consumption of the cooling apparatuses, taken together.

As a simple example, information collected from individual server computing devices can reveal that five server computing devices have fans operating at a maximum level, another five server computing devices have fans operating at a midpoint level, and fifty server computing devices have fans operating at a minimum level. Continuing with such a simple example, empirical data, or theoretical calculations, can further reveal that an increase in the speed of the data center air movers would generate an increased amount of air flow through each of the server computing devices, and that such an increased amount of airflow would have no effect on server computing devices whose fans were already operating at a minimum level, would allow server computing devices whose fans were operating at a midpoint level to reduce the speed of their fans such that the reduction in speed resulted in those servers' fans each consuming 0.5 W less energy, and would allow server computing devices whose fans were operating at a maximum level to reduce the speed of their fans to, for example, and midpoint level, with such a reduction in speed resulting in those servers' fans each consuming 2 W less energy. From such empirical data, or theoretical calculations, in combination with the information obtained from the server computing devices, a determination can be made that an increase in the speed of the data center air movers, given the conditions detailed by the present example, would result in no energy savings from the fifty server computing devices whose fans were already at a minimum level, would result in energy savings of 0.5 W from each of the five server computing devices whose fans were operating at a midpoint level, and would result in energy savings of 2 W from each of the five server computing devices whose fans were operating at maximum. Consequently, if the increase in the amount of energy consumed by the data center air movers, when their speed was increased to a contemplated higher speed, is than 12.5 W of energy, then the determination, at step 650, can determine that, in aggregate, energy savings can be realized by increasing the speed of the data center air movers. Determinations contemplating decreasing the speed of the data center air movers can be made in an analogous manner.

In one embodiment, the determination, at step 650, can be made in accordance with the group management and control algorithms described above. More specifically, in the above described embodiments, where management and control of data center infrastructure devices can be performed by groups of chassis manager computing devices, multiple chassis manager computing devices can participate in making the determination, at step 650.

In an embodiment utilizing a master computing device, each of the peer chassis manager computing devices can transmit, to such a master computing device, an indication of whether or not each chassis that is managed by such chassis manager computing devices, would benefit, in the form of increased energy savings, from an increase in the speed of the data center air movers. The master computing device can then determine, such as at step 650, whether to instruct the data center air movers to increase their speed based upon whether greater than a threshold number of such peer chassis managers indicated that their chassis would benefit from such an action. In an analogous manner, each of the peer chassis manager computing devices can transmit, to the master computing device, an indication of whether or not each chassis that is managed by such chassis managers would be negatively impacted, in the form of increased energy consumption, from a decrease in the speed of the data center air movers. The master computing device can then determine, at step 650, whether to instruct the data center air movers to decrease their speed based upon whether the number of peer chassis managers indicating that their chassis would be negatively impacted was less than the threshold number. The threshold number can be set based upon a comparison between the energy consumption of the cooling apparatuses of the chassis and the energy consumption of the data center air movers.

Conversely, in an embodiment where no master computing device is utilized, and the management and control of data center infrastructure devices is performed by collections of chassis managers through known consensus protocols, such consensus protocols can be utilized to determine, such as at step 650, whether to change the speed of the data center air movers. For example, each chassis manager computing device can vote on whether to increase or decrease the speed of the data center air movers based upon each chassis manager computing device's determination as to whether, and how much, such an increase or decrease the speed of the data center air movers would, correspondingly, decrease or increase the energy consumption of the cooling apparatuses of a chassis managed by such a chassis manager. In accordance with the consensus protocol implemented, such voting can reveal whether or not the speed of the data center air movers is to be increased or decreased, and an appropriate control output can be provided, to the data center air movers, by one of the peer chassis manager computing devices selected, as part of the consensus protocol, to be the device to communicate such control output.

Figure 7:
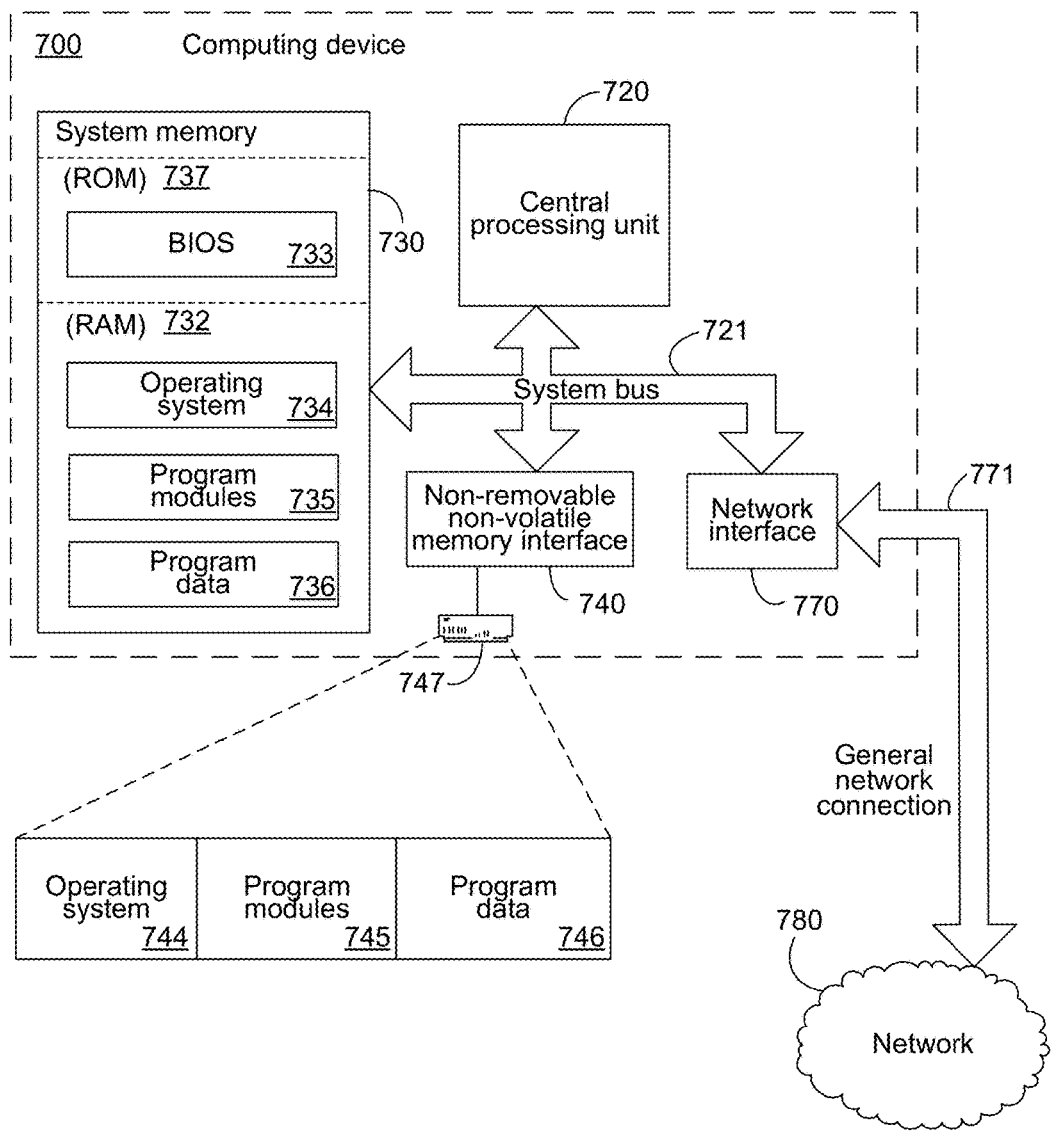
FIG. 7 is a block diagram illustrating an exemplary general purpose computing device.

Turning to FIG. 7, an exemplary general-purpose computing device 700 is illustrated. The exemplary general-purpose computing device 700 can be any one or more of the chassis manager computing devices, blade server computing devices, and other like computing devices was operation was described in detail above. The exemplary general-purpose computing device 700 can include, but is not limited to, one or more central processing units (CPUs) 720, a system memory 770 and a system bus 721 that couples various system components including the system memory to the processing unit 720. The system bus 721 may be any of several types of bus structures including a memory bus or memory controller, a peripheral bus, and a local bus using any of a variety of bus architectures. Depending on the specific physical implementation, one or more of the CPUs 720, the system memory 770 and other components of the general-purpose computing device 700 can be physically co-located, such as on a single chip. In such a case, some or all of the system bus 721 can be nothing more than communicational pathways within a single chip structure and its illustration in FIG. 7 can be nothing more than notational convenience for the purpose of illustration.

The general-purpose computing device 700 also typically includes computer readable media, which can include any available media that can be accessed by computing device 700. By way of example, and not limitation, computer readable media may comprise computer storage media and communication media. Computer storage media includes media implemented in any method or technology for storage of information such as computer readable instructions, data structures, program modules or other data. Computer storage media includes, but is not limited to, RAM, ROM, EEPROM, flash memory or other memory technology, CD-ROM, digital versatile disks (DVD) or other optical disk storage, magnetic cassettes, magnetic tape, magnetic disk storage or other magnetic storage devices, or any other medium which can be used to store the desired information and which can be accessed by the general-purpose computing device 700. Computer storage media, however, does not include communication media. Communication media typically embodies computer readable instructions, data structures, program modules or other data in a modulated data signal such as a carrier wave or other transport mechanism and includes any information delivery media. By way of example, and not limitation, communication media includes wired media such as a wired network or direct-wired connection, and wireless media such as acoustic, RF, infrared and other wireless media. Combinations of the any of the above should also be included within the scope of computer readable media.

The system memory 770 includes computer storage media in the form of volatile and/or nonvolatile memory such as read only memory (ROM) 771 and random access memory (RAM) 772. A basic input/output system 733 (BIOS), containing the basic routines that help to transfer information between elements within computing device 700, such as during start-up, is typically stored in ROM 731. RAM 732 typically contains data and/or program modules that are immediately accessible to and/or presently being operated on by processing unit 720. By way of example, and not limitation, FIG. 7 illustrates operating system 734, other program modules 735, and program data 736.

When using communication media, the general-purpose computing device 700 may operate in a networked environment via logical connections to one or more remote computers. The logical connection depicted in FIG. 7 is a general network connection 771 to the network 199, which can be a local area network (LAN), a wide area network (WAN) such as the Internet, or other networks. The computing device 700 is connected to the general network connection 771 through a network interface or adapter 770 that is, in turn, connected to the system bus 721. In a networked environment, program modules depicted relative to the general-purpose computing device 700, or portions or peripherals thereof, may be stored in the memory of one or more other computing devices that are communicatively coupled to the general-purpose computing device 700 through the general network connection 771. It will be appreciated that the network connections shown are exemplary and other means of establishing a communications link between computing devices may be used.

The general-purpose computing device 700 may also include other removable/non-removable, volatile/nonvolatile computer storage media. By way of example only, FIG. 7 illustrates a hard disk drive 741 that reads from or writes to non-removable, nonvolatile media. Other removable/non-removable, volatile/nonvolatile computer storage media that can be used with the exemplary computing device include, but are not limited to, magnetic tape cassettes, flash memory cards, digital versatile disks, digital video tape, solid state RAM, solid state ROM, and the like. The hard disk drive 741 is typically connected to the system bus 721 through a non-removable memory interface such as interface 740.

The drives and their associated computer storage media discussed above and illustrated in FIG. 7, provide storage of computer readable instructions, data structures, program modules and other data for the general-purpose computing device 700. In FIG. 7, for example, hard disk drive 741 is illustrated as storing operating system 744, other program modules 745, and program data 746. Note that these components can either be the same as or different from operating system 774, other program modules 775 and program data 776. Operating system 744, other program modules 745 and program data 746 are given different numbers here to illustrate that, at a minimum, they are different copies.

As can be seen from the above descriptions, mechanisms for controlling, with multiple computing devices, infrastructure devices providing a proper operating environment for such computing devices have been described. Which, in view of the many possible variations of the subject matter described herein, we claim as our invention all such embodiments as may come within the scope of the following claims and equivalents thereto.

We claim:

1. A computing device comprising: a processing unit; and one or more computer-readable media comprising computer-executable instructions that, when executed by the processing unit, cause the processing unit to perform steps comprising:
    receiving, from a first sensor, a first sensor input;
    selecting, with a set of computing devices comprising at least one other computing device, a master computing device from among the set of computing devices, the set of computing devices also comprising the computing device;
    determining, if the computing device was selected as the master computing device, a control of a first infrastructure device based at least in part on the received first sensor input;
    generating, if the computing device was selected as the master computing device, control output to the first infrastructure device to implement the determined control; and
    transmitting, if the computing device was not selected as the master computing device, the received first sensor input to one or more other computing devices of the set of computing devices;
    wherein the determining the control of the first infrastructure device comprises determining to control at least one air mover to increase a cooling provided to multiple computing devices if a resulting increase in an air mover energy consumption is less than a resulting decrease in a computing device fan energy consumption as aggregated across the multiple computing devices, the at least one air mover being external to each of the multiple computing devices, the increase in the cooling provided by the at least one air mover causing a resulting decrease in the cooling provided to at least some of the multiple computing devices from computing device fans that are internal to such multiple computing devices; and
    wherein the determining the control of the first infrastructure device comprises determining to control the at least one air mover to decrease the cooling provided to the multiple computing devices if the resulting decrease in the air mover energy consumption is greater than the resulting increase in the computing device fan energy consumption as aggregated across the multiple computing devices, the decrease in the cooling provided by the at least one air mover causing a resulting increase in the cooling provided to the at least some of the multiple computing devices from computing device fans that are internal to such multiple computing devices.

2. The computing device of claim 1, comprising further computer-executable instructions that, when executed by the processing unit, cause the processing unit to perform further steps comprising:
    determining, if the computing device was not selected as the master computing device, whether a selected master computing device has transmitted a heartbeat message within a predetermined period of time; and
    initiating selection of a new master computing device, from among the set of computing devices, if the determining reveals that the selected master computing device has not transmitted a heartbeat message within a predetermined period of time.

3. The computing device of claim 1, wherein the selecting the master computing device and the initiating selection of a new master computing device are both implemented in accordance with a consensus algorithm being implemented by the set of computing devices.

4. The computing device of claim 1, comprising further computer-executable instructions that, when executed by the processing unit, cause the processing unit to perform further steps comprising:
    transmitting, if the computing device was selected as the master computing device, a heartbeat message at a predetermined periodicity.

5. The computing device of claim 1, wherein the set of computing devices exclusively comprises computing devices managing hardware components of server chassis into which the set of server computing devices is installed.

6. The computing device of claim 1, comprising further computer-executable instructions that, when executed by the processing unit, cause the processing unit to perform further steps comprising:
if the computing device was selected as the master computing device, selecting, with a second set of computing devices that is different from the set of computing devices, a second level master computing device from among the second set of computing devices;
wherein the second set of computing devices comprises computing devices selected as master computing devices from among their respective sets of computing devices.

7. The computing device of claim 1, wherein the one or more other computing devices to which the received first sensor input is transmitted is only the master computing device.

8. The computing device of claim 1, wherein the one or more other computing devices to which the received first sensor input is transmitted are all computing devices of the set of computing devices.

9. A computing device comprising: a processing unit; and one or more computer-readable media comprising computer-executable instructions that, when executed by the processing unit, cause the processing unit to perform steps comprising:
managing, based on received sensor input, hardware components of a server chassis comprising at least some of a set of server computing devices;
receiving, from a first sensor, a first sensor input;
transmitting the received first sensor input to one or more other computing devices of a set of computing devices, the set of computing devices comprising both the computing device and at least one other computing device;
selecting, with the set of computing devices, a control of a first infrastructure device based at least in part on the received first sensor input;
selecting, with the set of computing devices, a communicator computing device to instruct the infrastructure device to implement the determined control; and
generating, if the computing device was selected as the communicator computing device, control output to the first infrastructure device to implement the determined control;
wherein the selecting the control of the first infrastructure device comprises selecting to control at least one air mover to increase a cooling provided to multiple computing devices if a resulting increase in an air mover energy consumption is less than a resulting decrease in a computing device fan energy consumption as aggregated across the multiple computing devices, the at least one air mover being external to each of the multiple computing devices, the increase in the cooling provided by the at least one air mover causing a resulting decrease in the cooling provided to at least some of the multiple computing devices from computing device fans that are internal to such multiple computing devices; and
wherein the selecting the control of the first infrastructure device comprises selecting to control the at least one air mover to decrease the cooling provided to the multiple computing devices if the resulting decrease in the air mover energy consumption is greater than the resulting increase in the computing device fan energy consumption as aggregated across the multiple computing devices, the decrease in the cooling provided by the at least one air mover causing a resulting increase in the cooling provided to the at least some of the multiple computing devices from computing device fans that are internal to such multiple computing devices.

10. The computing device of claim 9, wherein the selecting the control of the first infrastructure device and the selecting the communicator computing device are both implemented in accordance with a consensus algorithm being implemented by the set of computing devices.

11. The computing device of claim 9, comprising further computer-executable instructions that, when executed by the processing unit, cause the processing unit to perform further steps comprising:
determining a proposed control of the first infrastructure device based at least in part on the received first sensor input; and
proposing, to the set of computing devices, the proposed control as part of the selecting the control of the first infrastructure device.

12. The computing device of claim 9, comprising further computer-executable instructions that, when executed by the processing unit, cause the processing unit to perform further steps comprising:
transmitting status information about at least one of server computing devices in a server chassis; and
receiving, from at least one other computing device in the set of computing devices, status information about at least one of server computing devices in a second server chassis that is managed by the at least one other computing device from which the status information was received;
wherein the determining the proposed control is based on the transmitted status information and on the received status information.

13. The computing device of claim 9, wherein the one or more other computing devices to which the received first sensor input is transmitted are all computing devices of the set of computing devices.

14. A method for decreasing aggregate cooling device power consumption, the computer-executable instructions directed to steps comprising:
receiving, at a first computing device, a first sensor input from a first sensor;
selecting, with a set of computing devices comprising the first computing device and at least one other computing device, a master computing device;
transmitting, if the first computing device was not selected as the master computing device, the received first sensor input to one or more other computing devices of the set of computing devices;
determining a control of a first infrastructure device based at least in part on the received first sensor input; and
generating control output to the first infrastructure device, from the master computing device, to implement the determined control, the control output:
conditionally increasing a cooling provided to multiple computing devices by at least one air mover that is external to each of the multiple computing devices, the increasing resulting in a decrease in a cooling provided to at least some of the multiple computing devices from computing device fans that are internal to such multiple computing devices; and
conditionally decreasing the cooling provided to the multiple computing devices from the at least one air mover, the decreasing resulting in an increase in the cooling provided to at least some of the multiple computing devices from the computing device fans that are internal to such multiple computing devices;

wherein the conditionally increasing is conditioned on an increase in an air mover energy consumption of the at least one air mover due to the increased cooling provided by the at least one air mover being less than a decrease in a computing device fan energy consumption, due to the resulting decrease in the cooling provided from the computing device fans, as aggregated across the multiple computing devices; and wherein the conditionally decreasing is conditioned on a decrease in the air mover energy consumption due to the decreased cooling provided by the at least one air mover being greater than an increase in the computing device fan energy consumption, due to the resulting increase in the cooling provided from the computing device fans, as aggregated across the multiple computing devices.

15. The method of claim 14, wherein the conditionally increasing the cooling provided by the at least one air mover comprises predicting whether the increase in the air mover energy consumption will be less than the decrease in the computing device fan energy consumption; and wherein further the conditionally decreasing the cooling provided by the at least one air mover comprises predicting whether the decrease in the air mover energy consumption will be greater than the increase in the computing device fan energy consumption.

16. The method of claim 15, wherein the predicting is based on a current cooling being provided by the computing device fans to the multiple computing devices comprising the computing device fans.

17. The method of claim 14, wherein the conditionally increasing the cooling provided by the at least one air mover comprises: determining an initial energy consumption of the at least one air mover and the computing device fans, increasing the cooling provided by the at least one air mover; determining, subsequent to the increasing the cooling provided by the at least one air mover, a subsequent energy consumption of the at least one air mover and the computing device fans; and decreasing the cooling provided by the at least one air mover to undo the increasing the cooling provided by the at least one air mover if the determined initial energy consumption is less than the determined subsequent energy consumption; and wherein the conditionally decreasing the cooling provided by the at least one air mover comprises: determining the initial energy consumption of the at least one air mover and the computing device fans, decreasing the cooling provided by the at least one air mover; determining, subsequent to the decreasing the cooling provided by the at least one air mover, the subsequent energy consumption of the at least one air mover and the computing device fans; and increasing the cooling provided by the at least one air mover to undo the decreasing the cooling provided by the at least one air mover if the determined initial energy consumption is less than the determined subsequent energy consumption.

18. The method of claim 14, wherein the one or more other computing devices to which the received first sensor input is transmitted is only the master computing device.

19. The method of claim 14, wherein the one or more other computing devices to which the received first sensor input is transmitted are all computing devices of the set of computing devices.

20. The method of claim 14, wherein the determining the control of the first infrastructure device is only performed by the master computing device.

* * * * *